United States Patent [19]

Steinle et al.

[11] 4,356,553
[45] Oct. 26, 1982

[54] METHOD FOR THE MEASURING OF ELECTRICAL POWER

[75] Inventors: Benedikt Steinle, Zug; Gernot Schneider, Baar; Hans Nuenlist, Unterägeri, all of Switzerland

[73] Assignee: LGZ Landis & Gyr Zug AG, Zug, Switzerland

[21] Appl. No.: 201,489

[22] PCT Filed: Sep. 5, 1979

[86] PCT No.: PCT/CH79/00119
§ 371 Date: Jun. 25, 1980
§ 102(e) Date: Jun. 25, 1980

[87] PCT Pub. No.: WO80/01206
PCT Pub. Date: Jun. 12, 1980

[30] Foreign Application Priority Data

Dec. 1, 1978 [CH] Switzerland .................. 12300/78

[51] Int. Cl.³ ........................................... G01R 21/06
[52] U.S. Cl. ................................. 364/483; 324/76 R
[58] Field of Search .................. 364/483, 480, 481; 324/76 R

[56] References Cited

U.S. PATENT DOCUMENTS

| | | | |
|---|---|---|---|
| 4,056,775 | 11/1977 | Milkovic | 364/483 X |
| 4,077,061 | 2/1978 | Johnston et al. | 324/76 R X |
| 4,218,736 | 8/1980 | Haraguchi | 364/483 |
| 4,240,149 | 12/1980 | Fletcher et al. | 364/483 |
| 4,250,552 | 2/1981 | Elms | 364/483 |

Primary Examiner—Edward J. Wise
Attorney, Agent, or Firm—Ernest F. Marmorek

[57] ABSTRACT

In a method of measuring power delivered at an alternating voltage by an alternating current to a load, the steps include comparing the instantaneous alternating voltage and the instantaneous alternating current with a periodically varying reference signal having a relatively high frequency compared to the frequency of the alternating voltage and the alternating current, thereby obtaining a plurality of first voltage-intersection and current-intersection points during the negative-going portions of the reference signal, and a plurality of second voltage-intersection and current-intersection points during the positive-going portions of the reference signal, transforming the measured analog voltage-values and measured the analog current-values into digital voltage-values and digital current-values, respectively, multiplying the digital voltage-values and the digital current values at the first intersection points with one another, so as to obtain a plurality of first instantaneous power outputs, multiplying the digital voltage-values and the digital current-values at the second intersection points with one another, so as to obtain a plurality of second instantaneous power outputs, and continuously integrating the power outputs so as to obtain an average power output.

8 Claims, 11 Drawing Figures

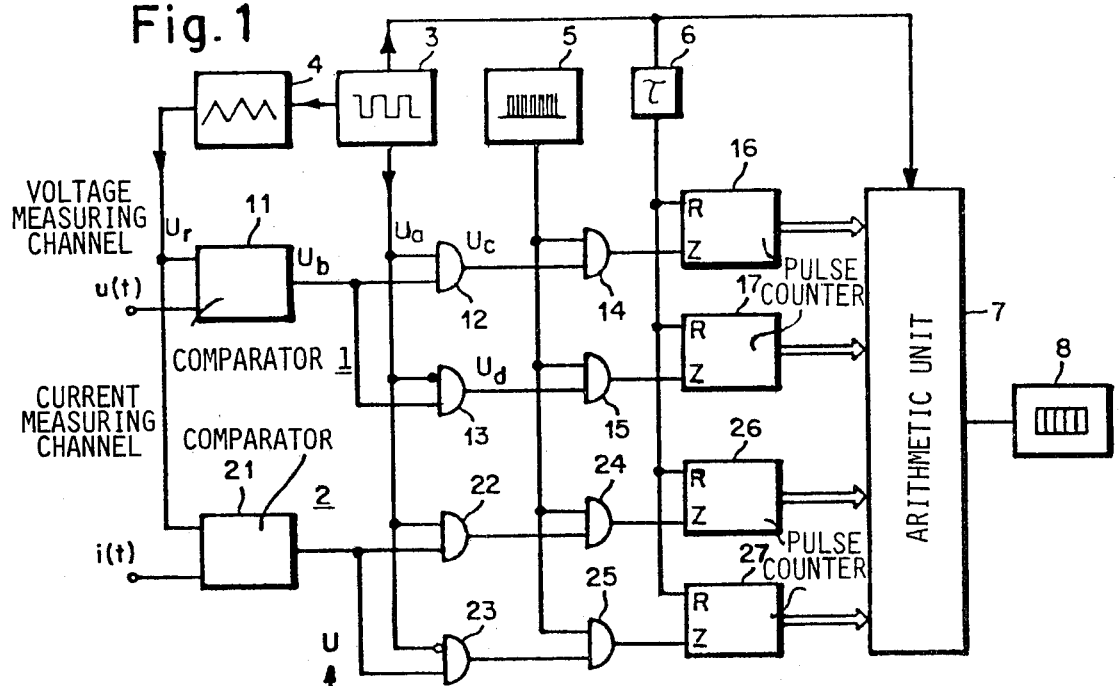
Fig. 1
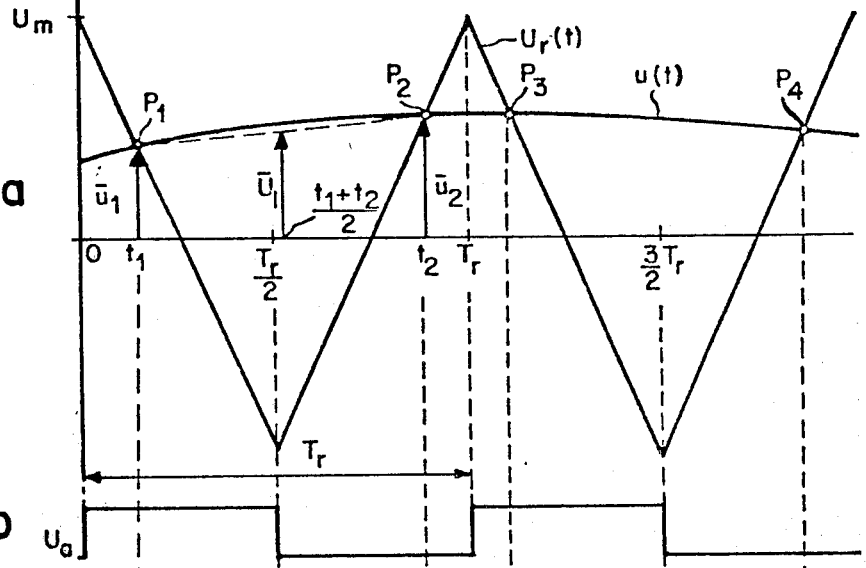
Fig. 2a
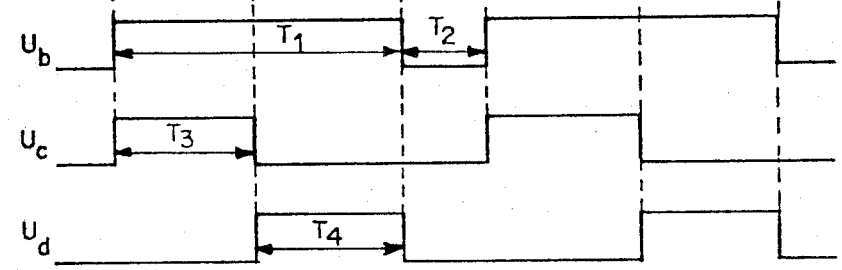
Fig. 2b
Fig. 2c
Fig. 2d
Fig. 2e

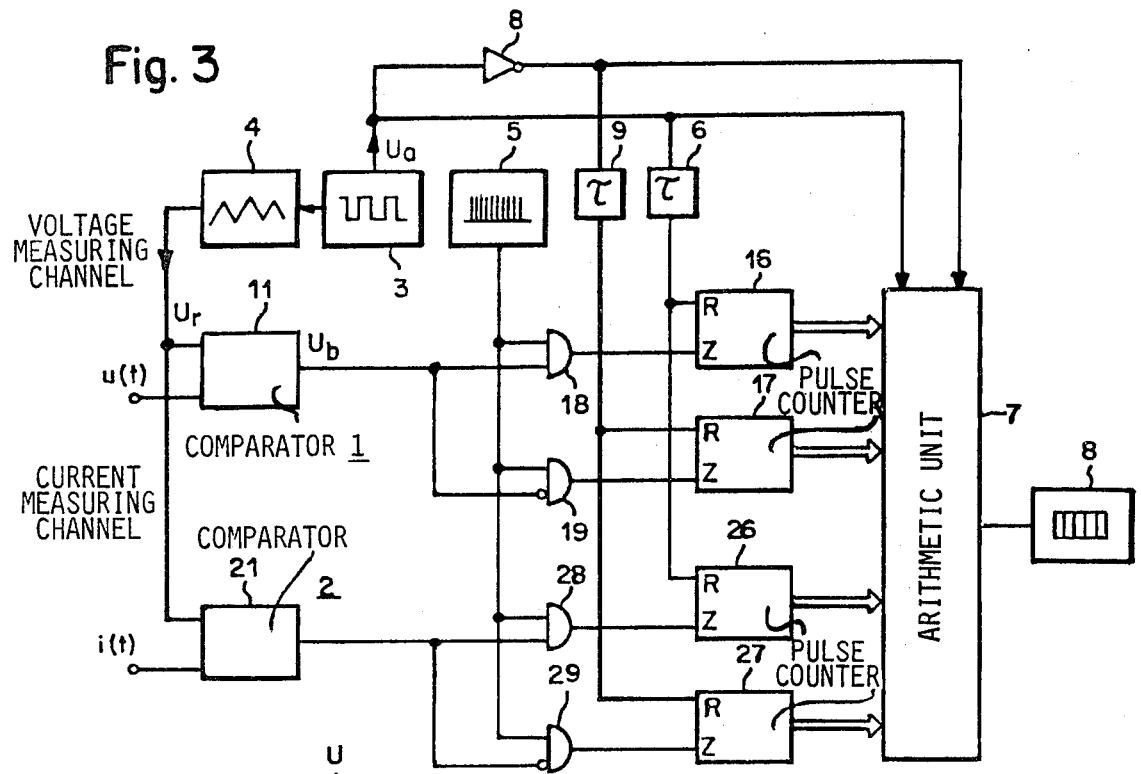
Fig. 3
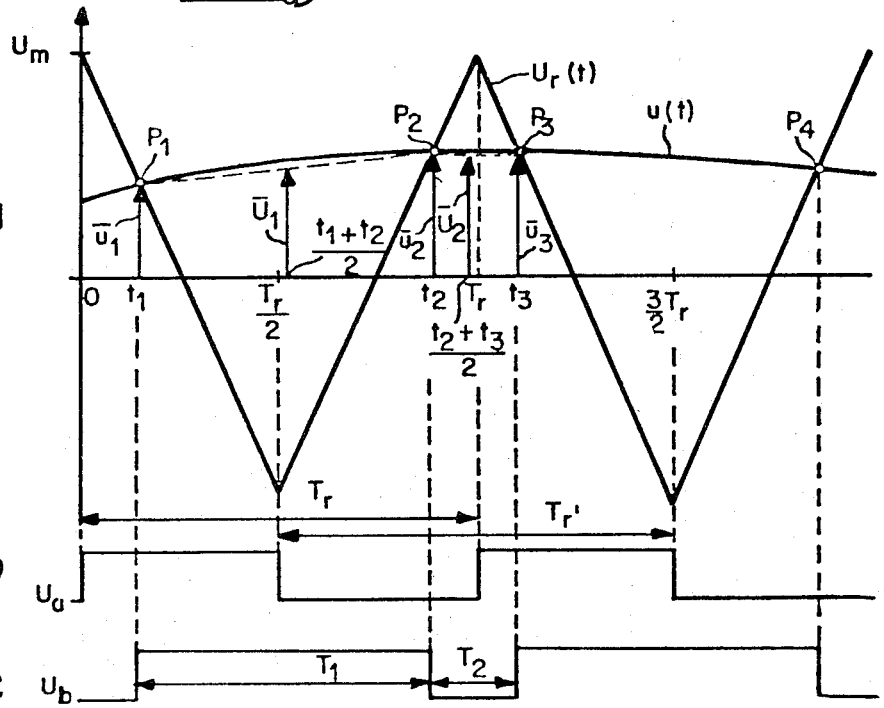
Fig. 4a
Fig. 4b
Fig. 4c

METHOD FOR THE MEASURING OF ELECTRICAL POWER

BACKGROUND OF THE INVENTION

In an earlier proposal (U.S. application Gernot Schneider et al, Ser. No. 90,734, filed on Nov. 2, 1979), a measuring device was described in which in each period of a reference signal, a digital measuring value is determined in each case for the voltage and a separate digital measuring value is determined in each case for the current. In another proposal, disclosed in German laid-open specification DE-OS 27 107 12, a method is described for obtaining the power output developed in a network by transforming scanned values of voltages and currents into pulses, which have respective average time occurrences proportional to the voltages and currents respectively, temporarily storing the so-obtained pulses in digital memories, generating interpolated pulses with the aid of synchronous switches and a logical connecting network at a predetermined probability, and obtaining a resulting pulse sequence at a probability of pulse occurrence proportional to the product of interpolated and non-interpolated pulses.

SUMMARY OF THE INVENTION

In accordance with FIG. 2a, a measuring signal u(t), which is proportional to the voltage, is compared with a periodically varying, preferably a delta shaped reference signal $U_r(t)$ and a pulse sequence $U_b$ (FIG. 2c) is formed, which at a point of time $t_1$, and at a point of time $t_2$ of an intersection point $P_1$ or $P_2$ of the two signals u(t) and $U_r(t)$ changes its logical state. The pulse duration $T_1$, that is to say the time difference $(t_2-t_1)$, is a measure for the average value $U_1=(\bar{u}_1+\bar{u}_2)/2$ of the measuring signal u(t) in the period $T_r$ of the reference signal $U_r(t)$, wherein $\bar{u}_1$ and $\bar{u}_2$ indicate the instantaneous value of the measuring signal u(t) at the point in time $t_1$ or $t_2$. By means of scanning pulses of high frequency, the pulse sequence $U_b$ is scanned and a number of pulses corresponding to the pulse duration $T_1$ are fed into a pulse counter. This number of pulses represent a digital measuring value for the average value of the voltage, which value is multiplied in an arithmatic unit with the digital average value of the current which has been ascertained in similar manner. One Thus one obtains a measure for the electrical power and through integration a measure for the electrical energy in the appropriate circuit.

Due to the finite frequency of the reference signal $U_r(t)$, a measuring error due to the set-up of the system itself results, when the measuring signal u(t) is not a constant, or is not a sinusoidally varying parameter quantity of low frequency. Thus, to give an example, when measuring the electrical power in an alternating-current power-supply, harmonics of the fundamental frequency which might be present, can not be detected in a correct manner. It should be pointed out, that the measuring error can be kept within acceptable limits when the frequency of the reference signal $U_r(t)$ is selected to be sufficiently high; to give an example, a doubling of this frequency reduces the measuring error to one fourth. However, due to the finite operating speeds of certain components, such as for example of the comparator, the frequency of the reference signal $U_r(t)$ can not be selected at an arbitrarily high degree.

The invention has as its object a reduction of the measuring error, without increasing the frequency of the reference signal $U_r(t)$.

By means of the method designed, according to the invention, the frequency of determining and multiplying the measuring value is doubled compared to the earlier proposal, as a result of which the measuring error is reduced to one fourth.

BRIEF DESCRIPTION OF THE DRAWING

The invention will be explained in the following in more detail by means of an example of a static electric meter for the measurement of electric energy in an alternating-current network.

FIG. 1 is a block circuit diagram of a static counter of electricity;

FIG. 2 is a voltage-time diagram applicable to the block-circuit diagram of FIG. 1;

FIG. 3 is a block circuit diagram of an alternate version of the static counter of electricity;

FIG. 4 is an additional voltage-time diagram applicable to FIG. 3; and

DESCRIPTION OF THE PREFERRED EMBODIMENTS

Figure 5:
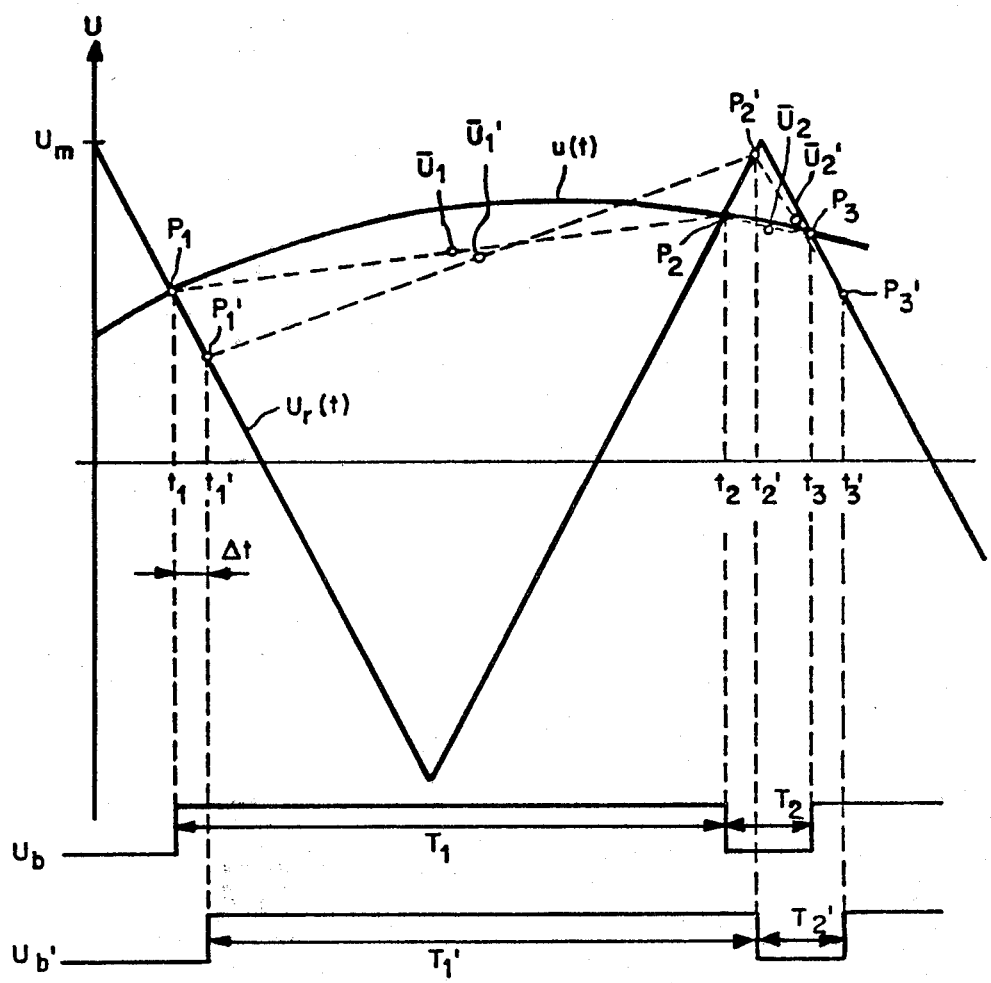
FIG. 5 is a voltage-time diagram showing the effect of any time delay of determining intersection points on the determination of average voltages or currents.

In the upper half portion of FIG. 1, a voltage measuring channel 1 is illustrated and in the bottom half portion a current measuring channel 2 is shown. A square-wave generator 3, a reference signal generator 4 which is controlled by the square wave generator 3, a scanning generator 5, and a time-delay member 6 are jointly assigned to the two measuring channels 1 and 2. The voltage measuring channel 1 consists of a comparator 11, of four AND-gates 12 to 15, and of two pulse-counters 16, 17, and the current measuring channel 2 consists of a comparator 21, of four AND-gates 22 to 25 and of two pulse counters 26, 27.

An electrical signal u(t) which is proportional to the voltage to be measured is applied to the first input of the comparator 11 and an electrical signal i(t) which is proportional to the current to be measured is applied to the first input of comparator 21. The output of the reference-signal generator 4 is connected in each case with the second input of the comparators 11, 21.

The output of comparator 11 is connected via the AND-gates 12 and 14 to the counting-input Z of the pulse counter 16, as well as being connected via the AND-gates 13 and 15 to the counting-input Z of pulse counter 17. In a corresponding manner, the output of the comparator 21 is connected via the AND-gates 22 and 24 to the counting-input Z of the pulse counter 26, as well as being connected via the AND-gates 23 and 25 to the counting-input Z of the pulse counter 27. The output of the square-wave generator 3 is connected in each case with the input of the AND-gates 12 and 22, with an inverting input of AND-gates 13 and 23, as well as being connected via the time-delay member 6 with the resetting-input R of the pulse-counters 16, 17, 26 and 27. The scanning generator 5 is connected in each case to the input of the AND-gates 14, 15, 24 and 25.

From the pulse counters 16, 17, 26 and 27, a data bus leads in each case to an arithmetic unit 7, which is controlled by the square-wave generator 3 and can be formed by a microcomputer. A pulse counter 8 is connected to the arithmetic unit 7.

The arithmetic unit 7 can, for example, be implemented by a microcomputer or microprocessor of the type 8080, manufactured by Intel Corporation, or equivalent microprocessors, manufactured by other companies. The arithmetic unit 7, or microprocessor, is programmed in a known manner so that it multiplies, on one hand the contents of the pulse counter 16 with the contents of the pulse counter 26 and on the other hand, multiplies the contents of the pulse counter 17 with the contents of the pulse counter 27. A program for the multiplication of data bytes is described, for example, in the "8080 Assembly Language Programming Manual, Order Number 9800301B, 1977 edition," of Intel Corporation.

The arrangement which has been described here operates in the following manner.

The square-wave generator 3 produces a pulse signal, for example, a symmetrical square-wave voltage $U_a$ having a time period $T_r$ (FIG. 2b). The reference signal generator 4 which is controlled by the square-wave generator 3 provides an output with a periodically varying reference signal $U_r(t)$ having a time period $T_r$ which, in the illustrated example, is a triangular, or delta-shaped voltage (FIG. 2a) which has symmetrical positive-going and negative-going portions, but could also be another time-function having a time period $T_r$, and well-defined signal-reversal points. The comparator 11 compares the measuring signal u(t) with the reference signal $U_r(t)$. FIG. 2a shows an example of the measuring signal u(t), which intersects the reference signal $U_r(t)$ at points $P_1$ through $P_4$. At each of these intersection-points, the pulse-sequence $U_b$ (FIG. 2c) obtained from the comparator 11 changes its logical state. The comparator 11 cooperates with the reference-signal generator 4 to provide a as socalled mark - space-modulator, according to the relation $$\frac{T_1 - \frac{T_r}{2}}{T_r} = k \cdot \overline{U}_1$$

wherein $T_1$ indicates the pulse duration of the pulse sequence $U_b$ and k is a constant.

At the output of the AND-gate 12 a pulse sequence $U_c$ (FIG. 2d) with a pulse duration $T_3$ is formed and at the output of the AND-gate 13 a pulse sequence $U_d$ (FIG. 2e) with a pulse duration $T_4$ is formed. A pulse of the pulse sequence $U_c$ begins in each case in the first half-period of the reference signal $U_r(t)$ at the point of time $t_1$ of the intersecting-point $P_1$ and ends at the end of the first half-period at the reversal-time $T_r/2$ of the reference signal. The beginning of the second half-period of the reference signal $U_r(t)$, starts with a pulse of the pulse sequence $U_d$. This pulse ends at the point of time $t_2$ of the intersecting-point $P_2$. The pulse duration $T_3$ represents an analog measuring value $\overline{u}_1$ for the measuring signal u(t) at the point of time $t_1$, and the pulse duration $T_4$ represents an analog measuring value $\overline{u}_2$ for the measuring signal u(t) at the point of time $t_2$:

$$\overline{u}_1 = (U_m/T_r)(4T_3 - T_r) \quad (1)$$

$$\overline{u}_2 = (U_m/T_r)(4T_4 - T_r) \quad (2)$$

wherein $U_m$ indicates the peak value of the reference signal $U_r(t)$.

The scanning generator 5 produces narrow scanning pulses at a high frequency in comparison to the time-duration $T_r$. During the pulse-duration $T_3$, the AND-gate 14 allows the scanning pulses to pass through, so that a number of pulses proportional to the pulse-duration $T_3$ are fed to the pulse counter 16. During the pulse-duration $T_4$, the AND-gate 15 allows the scanning pulses to pass through and a number of pulses proportional to the duration of the period $T_4$ are fed to the pulse counter 17.

The above explanations of the mode of operation of the voltage measuring channel 1 are valid in an analogous manner also for the current measuring channel 2. In the first half-period of the reference signal $U_r(t)$, the scanning pulses are fed to the pulse counter 26, and in the second half-period the scanning pulses are fed to the pulse counter 27, so that the number of the fed scanning pulses corresponds in each case to a digital measuring value for the current. At the end of the period $T_r$, the content of the pulse-counters 16, 17, 26 and 27 is transferred to the arithmetic unit 7. In the latter, the content of the pulse-counter 16 (or a quantity derived from that content in accordance with equation (1)) is multiplied with the content of the pulse counter 26, on the one hand, and on the other hand, the content of the pulse counter 17 is multiplied with the content of the pulse counter 27. Each of the products formed in this manner is a measure of the instantaneous value of the power ouptut. Through a pulse at the resetting-input R, the pulse-counters 16, 17, 26 and 27 are again reset.

In each period of the reference signal $U_r(t)$, the described process is repeated anew. From the continuously arriving instantaneous values of the power output, the average value of the power output or of the electric energy is determined through integration in the arithmetic unit 7 or in the pulse-counter 8.

Since in each half-period of the reference signal $U_r(t)$ a digital measuring value $\overline{u}_1$ or $\overline{u}_2$ is determined in each case for the voltage, and a digital measuring value is determined for the current, and since the product of the two measuring values is formed, there is obtained - in contrast to the method of multiplying in each case only the average value $\overline{U}_1$ of the voltage with the corresponding average value of the current a doubling of the frequency of the formation of products, and measurement values, which in turn, reduces the measuring error to one quarter.

In FIG. 3, reference symbols which are the same as those in FIG. 1, point to similar components. The output of the comparator 11 is connected with an input of an AND-gate 18, as well as with an inverting input of an AND-gate 19, and the output of the comparator 21 is connected with an input of an AND-gate 28, as well as with an inverting input of an AND-gate 29. The scanning generator 5 is connected in each case to a second input of the AND-gates 18, 19, 28 and 29. On the output-side, each of these AND-gates is connected with the counting-input Z of the pulse-counters 16, 17, 26 or 27 assigned to it. The output of the square-wave generator 3 is connected via the time-delay member 6 to the resetting-inputs R of the pulse counters 16 and 26, on the one hand, and on the other hand is connected via an inverter 8 and a time-delay member 9 to the resetting inputs R of the pulse-counters 17 and 27. Furthermore, the square-wave generator 3 controls the arithmetic unit 7, directly, as well as indirectly via the inverter 8.

The mode of operation of the aforenoted arrangement will now be explained in detail with the aid of FIG. 4. During the $T_r$-period of the reference signal $U_r(t)$, the AND-gate 18 allows the scanning pulses of the scanning generator 5 to pass through during the pulse-duration $T_1$ of the pulse sequence $U_b$ (FIG. 4c). A number of scanning pulses proportional to the pulse-duration $T_1$ are fed to the pulse counter 16 representing, in accordance with the equation $$\overline{U}_1 = (U_m/T_r)(2T_1 - T_r) \qquad (3)$$

a digital measurement value corresponding to the average value of $$U_1 = (\overline{u}_1 + \overline{u}_2)/2 \qquad (4)$$

the measuring signal u(t) during the time period $T_1$. In analogous manner a number of scanning pulses are fed to the pulse counter 26, which represent a digital measuring value corresponding to the average value of the current. At the end of the period $T_r$, the content of the pulse counter 16 and the contact of the pulse counter 26 are transferred to the arithmetic unit 7 and, in accordance with equation (3), are transformed there to a measuring value proportional to the average value $\overline{U}_1$ and are then multiplied with one another. Shortly thereafter, the pulse counters 16 and 26 are reset.

In a period $T_r'$, which is made up of the second half-period and the following first half-period of the reference signal $U_r(t)$, namely a period which in accordance with FIG. 4 start at the point of time $T_r/2$ and ends at the point of time $3/2\ T_r$, a second average value is formed, namely $$\overline{U}_2 = (\overline{u}_2 + \overline{u}_3)/2 \qquad (5).$$

Here, $\overline{u}_3$ indicates the instantaneous value of the measuring signal u(t) at the point of time $t_3$, that is to say at the first intersecting point $P_3$ in the next $T_r$-period of the reference signal $U_r(t)$.

Within the period $T_r'$ the AND-gate 19 allows the scanning pulses to pass through during the duration of the interval $T_2$ of the pulse sequence $U_b$, that is to say during the time-difference $(t_3 - t_2)$. A number of scanning pulses proportional to the interval-duration $T_2$ are fed to the pulse counter 17 in accordance with the following formula $$\overline{U}_2 = (U_m/T_r)(T_r - 2T_2) \qquad (6)$$

this number of scanning pulses represents a digital measuring value corresponding to the average value $\overline{U}_2$ of the measuring signal u(t) during the time period $T_2$. A number of scanning pulses are fed in analogous manner to the pulse counter 27 in the $T_r'$-period, which number of scanning pulses represents a measure for the average value of the current within the $T_r'$-period.

At the end of the $T_r'$-period, the pulse-counters 17 and 27 are interrogated and shortly thereafter are reset. The measuring values ascertained in this manner are then transformed in the arithmetic unit 7 in accordance with equation (6) and are multiplied with one another.

The aforenoted process is repeated with the frequency of the reference signal $U_r(t)$. Thus, per $T_r$-period, two measuring values $\overline{U}_1$ and $\overline{U}_2$ are ascertained for the voltage and are multiplied with the corresponding measuring values for the current, so that also in the case of the arrangement according to FIG. 3, in contrast with the earlier proposal a doubling of the frequency of determining and multiplying the measuring values, and hence a reduction of the measuring error to one quarter of the corresponding earlier value is obtained.

As has already been mentioned, the average values $\overline{U}_1$ and $\overline{U}_2$ of the measuring signals u(t) and i(t), respectively, can be determined in the arithmetic unit 7 by means of equations (3) and (6) from the contents of the counters 16, 17, 26, and 27. As the terms $U_m$ and $T_r$ in equations (3) and (6) are constant values, the average values $\overline{U}_1$ and $\overline{U}_2$ can be determined from equations (3) and (6) by the respective subtraction operations $2T_1 - T_r$, and $T_r - 2T_2$, where $T_1$ corresponds to the contents of counters of 16, or 26 respectively, and $T_2$ corresponds to the contents the counters 17 and 27, respectively.

It will be understood that the digital measuring values corresponding to the average values $\overline{U}_1$ and $\overline{U}_2$ of the measuring signals u(t) and i(t) can also be determined by computing them from the digital measuring values corresponding to the instantaneous values $\overline{u}_1$, $\overline{u}_2$ and $\overline{u}_3$. In other words, this indicates that in the case of the arrangement according to FIG. 1, the arithmetic unit 7 is operated in such a manner that it computes the digital measuring values corresponding to the average values $U_1$ and $U_2$ from the counting-states of the pulse-counters 16, 17, 26 and 27.

The determination of the instantaneous values $\overline{u}_1$, $\overline{u}_2$, and $\overline{u}_3$ from the impulse durations $T_3$ and $T_4$, respectively, requires only implementation of the respective subtraction operations $4T_3 - T_r$, and $4T_4 - T_r$, and the determination of the average values $\overline{U}_1$ and $\overline{U}_2$ from the instantaneous values $\overline{u}_1$, $\overline{u}_2$, and $\overline{u}_3$ requires only implementation of the respective addition operations $\overline{u}_1/2 + \overline{u}_2/2$ and $\overline{u}_2/2 + \overline{u}_3/2$. Programs for the addition and subtraction of data bytes are also described in the above-noted Assembly Language Programming Manual.

It can be readily seen, that in actual practice the intersecting points $P_1$, $P_2$, $P_3$, $P_4$ ... can not be determined by means of the comparators 11, 21 with any desired degree of accuracy. Due to the finite operating speed of these comparators an unavoidable delay in time occurs during the determination of the intersecting points, which delay in time can be dependent on the magnitude of the signal and on the gradient of the measuring signals u(t) and i(t). By means of FIG. 5 it is shown that in the case of the described measurement of the average values $\overline{U}_1$ and $\overline{U}_2$, such delays in time hardly have any effect on the measuring result. If one assumes that the comparator 11 is not switched over in each case at the points in time $t_1$, $t_2$, $t_3$ ..., but is switched over only at the points of time delayed by the time delay $\Delta t$, namely at $t_1' = t_1 + \Delta t$, $t_2' = t_2 + \Delta t$, $t_3' = t_3 = \Delta t$ ..., one then does not determine the true intersecting points $P_1$, $P_2$, $P_3$ ... , but determines the apparent intersecting points $P_1'$, $P_2'$, $P_3'$ .... At the output of comparator 11, the desired pulse sequence $U_b$ does not appear, but what does appear is a pulse sequence $U_b'$, delayed with respect to the pulse sequence $U_b$, and having pulse duration $T_1'$ and an interval-duration $T_2'$. Although the apparent intersecting points $P_1'$, $P_2'$, $P_3'$ ... greatly deviate in the example shown from the true intersecting points $P_1$, $P_2$, $P_3$ ..., the actually determined average values $\overline{U}_1'$ and $\overline{U}_2'$ are approximately equal to the true average values $\overline{U}_1$ and $\overline{U}_2$:

$$\overline{U}_1 = (U_m/T_r)(2T_1 - T_r) \approx \overline{U}_1' = (U_m/T_r)(2T_1' - T_r)$$

$$\overline{U}_2 = (U_m/T_r)(T_r - 2T_2) \approx \overline{U}_2' = (U_m/T_r)(T_r - 2T_2')$$

We claim:

1. In a method of measuring power delivered at an alternating voltage by an alternating current to a load, the steps comprising:
   comparing the instantaneous alternating voltage and the instantaneous alternating current with a periodically varying reference signal having a relatively high frequency compared to the frequency of the alternating voltage and the alternating current, thereby obtaining a plurality of first voltage-intersection and current-intersection points during the negative-going portions of the reference signal, and a plurality of second voltage intersection and current-intersection points during the positive-going portions of the reference signal,
   said voltage intersection points representing instantaneous analog measurement values for the voltage, and said current intersection points representing instantaneous analog measurement values for the current,
   transforming the measured analog voltage values and the measured analog current-values into digital voltage values and digital current-values, respectively,
   multiplying the digital voltage values and the digital current-values at the first intersection points with one another, so as to obtain a plurality of first instantaneous power outputs,
   multiplying the digital voltage values and the digital current-values at the second intersection points with one another, so as to obtain a plurality of second instantaneous power outputs, and
   continuously integrating said power outputs so as to obtain an average power output.

2. In a method as claimed in claim 1, wherein said reference signal is defined by signal reversal points, further comprising the step of generating a plurality of scanning pulses at a frequency considerably greater than the frequency of said reference signal, and wherein the transforming step includes the step of counting the scanning pulses during a first time period from a first intersection point to the next signal reversal point, and during a second time period from said next signal reversal point to a second intersection point, following said first intersection point.

3. In a method of measuring power delivered at an alternating voltage by an alternating current to a load, the steps comprising:
   comparing the instantaneous alternating voltage and the instantaneous alternating current with a periodically varying reference signal having a relatively high frequency compared to the frequency of the alternating voltage and the alternating current, thereby obtaining a plurality of first voltage-intersection and current-intersection points during the negative-going portions of the reference signal, and a plurality of second voltage intersection and current-intersection points during the positive-going portions of the reference signal,
   said voltage intersection points representing analog measurement values for the voltage, and said current intersection points representing analog measurement values for the current,
   transforming the measured analog voltage-values into digital voltage values corresponding to first and second average alternating voltage values in a first interval between one of said first and a following second voltage intersection points, and in a second interval between said following second and a subsequent first voltage intersection points, respectively,
   transforming the measured analog current-values into digital current values corresponding to first and second average alternating current values in a third interval between one of said first and a following second current intersection points, and in a fourth interval between said following second and a subsequent first current-intersection points, respectively,
   multiplying said first average alternating voltage values and current values and said second average alternating voltage values and current values with one another, respectively, thereby obtaining first and second average power outputs during said first and second intervals, respectively, and
   continuously integrating said average power outputs during corresponding of said intervals, so as to obtain a continuous average power output.

4. In a method as claimed in claim 3, wherein said reference signal is defined by signal reversal points, and further comprising the step of generating a plurality of scanning pulses at a frequency considerably greater than the frequency of the reference signal, and wherein the transforming step includes the step of counting the scannning pulses during a first time period of the reference signal from a first intersection point to a second intersection point following said first intersection point, and during a second time period of the reference signal from said second intersection point following said first intersection point to another first intersection point following said second intersection point,
   said second time period of the reference signal being displaced by a one-half time period from the first time period.

5. In a method as claimed in claim 3, wherein said analog measurement values for the voltage and said analog measurement values for the current are instantaneous analog voltage measurement values and current-measurement values, respectively, and wherein transforming the measured analog values to average digital values comprises the step of obtaining the average digital voltage values and the average digital current values from said instantaneous analog voltage values and analog current values, respectively.

6. In a method as claimed in claims 1 or 3, wherein said periodically varying reference signal is a triangular waveform.

7. In a method as claimed in claim 6, wherein said triangular waveform has symmetrical positive portions and negative portions, respectively.

8. In a method as claimed in claims 2 or 4, further comprising the steps of generating a pulse signal having a first state during said first time period, and a second state during said second time period, whereby said scanning pulses may be counted during said first and second time periods, respectively.

* * * * *